United States Patent
Suo et al.

(10) Patent No.: US 10,475,735 B2
(45) Date of Patent: Nov. 12, 2019

(54) METHODS AND APPARATUS FOR 3D MIM CAPACITOR PACKAGE PROCESSING

(71) Applicant: APPLIED MATERIALS, INC., Santa Clara, CA (US)

(72) Inventors: Peng Suo, Singapore Science Park (SG); Guan Huei See, Singapore (SG); Arvind Sundarrajan, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 97 days.

(21) Appl. No.: 15/623,704

(22) Filed: Jun. 15, 2017

(65) Prior Publication Data

US 2018/0366401 A1 Dec. 20, 2018

(51) Int. Cl.
*H01L 23/498* (2006.01)
*H01L 21/8234* (2006.01)
(Continued)

(52) U.S. Cl.
CPC ........... *H01L 23/49838* (2013.01); *H01L 21/823487* (2013.01); *H01L 23/3677* (2013.01);
(Continued)

(58) Field of Classification Search
CPC ...................................................... H01L 28/40
(Continued)

(56) References Cited

U.S. PATENT DOCUMENTS 5,189,503 A 2/1993 Suguro et al.
6,180,976 B1 * 1/2001 Roy .................... H01L 23/5223
257/306
(Continued)

OTHER PUBLICATIONS

W.S. Liao, C.H. Chang, S.W. Huang, T.H. Liu, H.P. Hu, H.L. Lin, C.Y. Tsai, C.S. Tsai, H.C. Chu, C.Y. Pai, W.C. Chiang, S.Y. Hou, S.P. Jeng and Doug Yu, A manufacturable interposer MIM decoupling capacitor with robust thin high-K dielectric for heterogeneous 3D IC CoWoS wafer level system integration, Research and Development, Taiwan Semiconductor Manufacturing Company, Ltd., No. 168, Park Ave. II, Hsinchu Science Park, Hsinchu, Taiwan 30075, R.O.C., Tel: 886-3-5636688 Ext. 722-5769, Fax: 886-3-6687827, Email: wsliaoc@tsmc.com, pp. 27.3.1-27.3.4.
(Continued)

*Primary Examiner* — Nilufa Rahim
(74) *Attorney, Agent, or Firm* — Moser Taboada; Alan Taboada

(57) ABSTRACT

Methods of processing a substrate include: providing a substrate with a first polymer dielectric layer; forming a first RDL on the first polymer dielectric layer; constructing a 3D MIM capacitive stack on the first RDL in at least one opening in a top surface of a second polymer dielectric layer, the 3D MIM capacitive stack having a top electrode, a bottom electrode, and a capacitive dielectric layer interposed between the top electrode and the bottom electrode; depositing a dielectric layer on the 3D MIM capacitive stack and on the second polymer dielectric layer; and removing a portion of the dielectric layer to expose at least a portion of the top electrode at a bottom of at least one opening of the 3D MIM capacitive stack and to expose at least a portion of the metal layer at a bottom of at least one opening of the second polymer dielectric layer.

20 Claims, 4 Drawing Sheets

(51) Int. Cl.
*H01L 49/02* (2006.01)
*H01L 27/02* (2006.01)
*H01L 23/522* (2006.01)
*H01L 23/367* (2006.01)
*H01L 25/065* (2006.01)
*H01L 25/00* (2006.01)
*H01L 23/00* (2006.01)

(52) U.S. Cl.
CPC ...... *H01L 23/5223* (2013.01); *H01L 25/0657* (2013.01); *H01L 25/50* (2013.01); *H01L 27/0207* (2013.01); *H01L 28/40* (2013.01); *H01L 24/06* (2013.01); *H01L 2225/06541* (2013.01)

(58) Field of Classification Search
USPC .......................................................... 257/278
See application file for complete search history.

(56) References Cited

U.S. PATENT DOCUMENTS

| | | |
|---|---|---|
| 6,430,028 B1 | 8/2002 | Kar-Roy et al. |
| 6,452,251 B1* | 9/2002 | Bernstein ............ H01L 23/5223 |
| | | 257/301 |
| 9,461,106 B1 | 10/2016 | Yang et al. |
| 2002/0074584 A1 | 6/2002 | Yang |
| 2006/0024899 A1* | 2/2006 | Crenshaw ........... H01L 23/5223 |
| | | 438/381 |
| 2012/0112314 A1 | 5/2012 | Jou et al. |
| 2013/0307119 A1* | 11/2013 | Chen .................... H01L 21/568 |
| | | 257/532 |
| 2015/0221714 A1 | 8/2015 | Gu et al. |
| 2016/0276324 A1 | 9/2016 | Lin et al. |
| 2017/0104056 A1 | 4/2017 | See et al. |

OTHER PUBLICATIONS

A. Bajolet(1,2), J.-C. Giraudin(1), C. Rossato(1), L. Pinzelli(1), S. Bruyère(1), S. Crémer(1), T. Jagueneau(1), P. Delpech(1), L. Montès(2) and G. Ghibaudo(2), Three-dimensional 35 nF/mm$^2$ MIM Capacitors Integrated in BiCMOS Technology, Proceedings of ESSDERC, Grenoble, France, 2005, (1) ST Microelectronics, 850 rue Jean Monnet, 38926 Crolles, France. (2) IMEP (UMR 5130 CNRS-INPG-UJF), 23 rue des Martyrs, B.P. 257, 38016 Grenoble Cedex, France. aurelle.bajolet@st.com, pp. 121-124.

Search Report and Written Opinion dated Sep. 21, 2018 for PCT Application No. PCT/US2018/036017.

* cited by examiner

METHODS AND APPARATUS FOR 3D MIM CAPACITOR PACKAGE PROCESSING

FIELD

Embodiments of the present principles generally relate to semiconductor processes used in packaging semiconductor devices.

BACKGROUND

A semiconductor memory device generally comprises a plurality of memory cells which are used to store a large quantity of information. Each memory cell includes a capacitor for storing electric charge and a corresponding field effect transistor for opening and closing charging and discharging passages of the capacitor. As the size of semiconductor devices continues to shrink, the area allowed to be occupied by each component of a semiconductor device decreases. Capacitors are one component that can occupy considerable area on a semiconductor die depending on the size of the capacitor and/or the number of capacitors on the die.

One example of a capacitor used in a semiconductor memory device is a metal-insulator-metal (MIM) capacitor. A traditional MIM capacitor is two-dimensional (2D). A 2D MIM capacitor has two facing metal plates which are planar and substantially parallel to each other and to the substrate. One method of increasing the capacitance of a MIM capacitor is to increase the sizes of the metal plates. However, increasing the sizes of the metal plates will consume more surface area of the substrate. A 3-dimensional (3D) MIM capacitor allows for the same capacitive surface area but consumes less surface area of a substrate. However, a 3D MIM capacitor can lose performance if a leakage current develops between the two metal plates.

Accordingly, the inventors have developed an improved 3D MIM capacitor and method of forming a 3D MIM capacitor.

SUMMARY

In some embodiments, a method of processing a substrate comprises providing a substrate having a first polymer dielectric layer; forming a first redistribution layer (RDL) on the first polymer dielectric layer, the first RDL comprising a second polymer dielectric layer with a metal layer embedded in the second polymer dielectric layer and at least one opening in a top surface of the second polymer dielectric layer to expose at least a portion of the metal layer; constructing a 3D MIM capacitive stack on the first RDL in at least one opening in the top surface of the second polymer dielectric layer, the 3D MIM capacitive stack having a top electrode, a bottom electrode, and a capacitive dielectric layer interposed between the top electrode and the bottom electrode, the bottom electrode in electrical contact with the metal layer; depositing a dielectric layer on the 3D MIM capacitive stack and on the second polymer dielectric layer; and removing a portion of the dielectric layer to expose at least a portion of the top electrode at a bottom of at least one opening of the 3D MIM capacitive stack and to expose at least a portion of the metal layer at a bottom of at least one opening of the second polymer dielectric layer.

In some embodiments, a method of processing a substrate comprises providing a substrate having a first polymer dielectric layer; forming a first redistribution layer (RDL) on the first polymer dielectric layer, the first RDL comprising a second polymer dielectric layer with a metal layer embedded in the second polymer dielectric layer and at least one opening in a top surface of the second polymer dielectric layer to expose at least a portion of the metal layer; constructing a three-dimensional (3D) metal-insulator-metal (MIM) capacitive stack on the first RDL in at least one opening in the top surface of the second polymer dielectric layer, the 3D MIM capacitive stack having a top electrode, a bottom electrode, and a capacitive dielectric layer interposed between the top electrode and the bottom electrode, the bottom electrode in electrical contact with the metal layer; depositing a dielectric layer on the 3D MIM capacitive stack and on the second polymer dielectric layer; and removing a portion of the dielectric layer to expose at least a portion of the top electrode at a bottom of at least one opening of the 3D MIM capacitive stack and to expose at least a portion of the metal layer at a bottom of at least one opening of the second polymer dielectric layer.

In some embodiments, a substrate comprises a first polymer dielectric layer; a metal layer on the first polymer dielectric layer; a second polymer dielectric layer on the first polymer dielectric layer and the metal layer, wherein the second polymer dielectric layer comprises a plurality of openings etched to a top surface of the metal layer; a three-dimensional (3D) metal-insulator-metal (MIM) capacitive stack formed on the second polymer dielectric layer with a bottom electrode of the 3D MIM capacitive stack making electrical contact with the metal layer via at least one opening in the second polymer dielectric layer, the 3D MIM capacitive stack having a top electrode, a bottom electrode, and a capacitive dielectric layer interposed between the top electrode and the bottom electrode; a dielectric layer on the 3D MIM capacitive stack and the second polymer dielectric layer, the dielectric layer having at least one opening to the metal layer in at least one of the plurality of openings of the second polymer dielectric layer; a first contact formed on the second polymer dielectric layer, the first contact electrically connected with the metal layer; and a second contact formed on the 3D MIM capacitive stack, the second contact electrically connected to the top electrode of the 3D MIM capacitive stack.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods for processing a substrate are provided herein. The inventive methods advantageously facilitate an improved 3D MIM capacitor and method of forming a 3D MIM capacitor having reduced leakage current, enhanced system performance of the overall system (e.g., shorter connection paths), and faster processing times due to fewer required layers.

Figure 1:
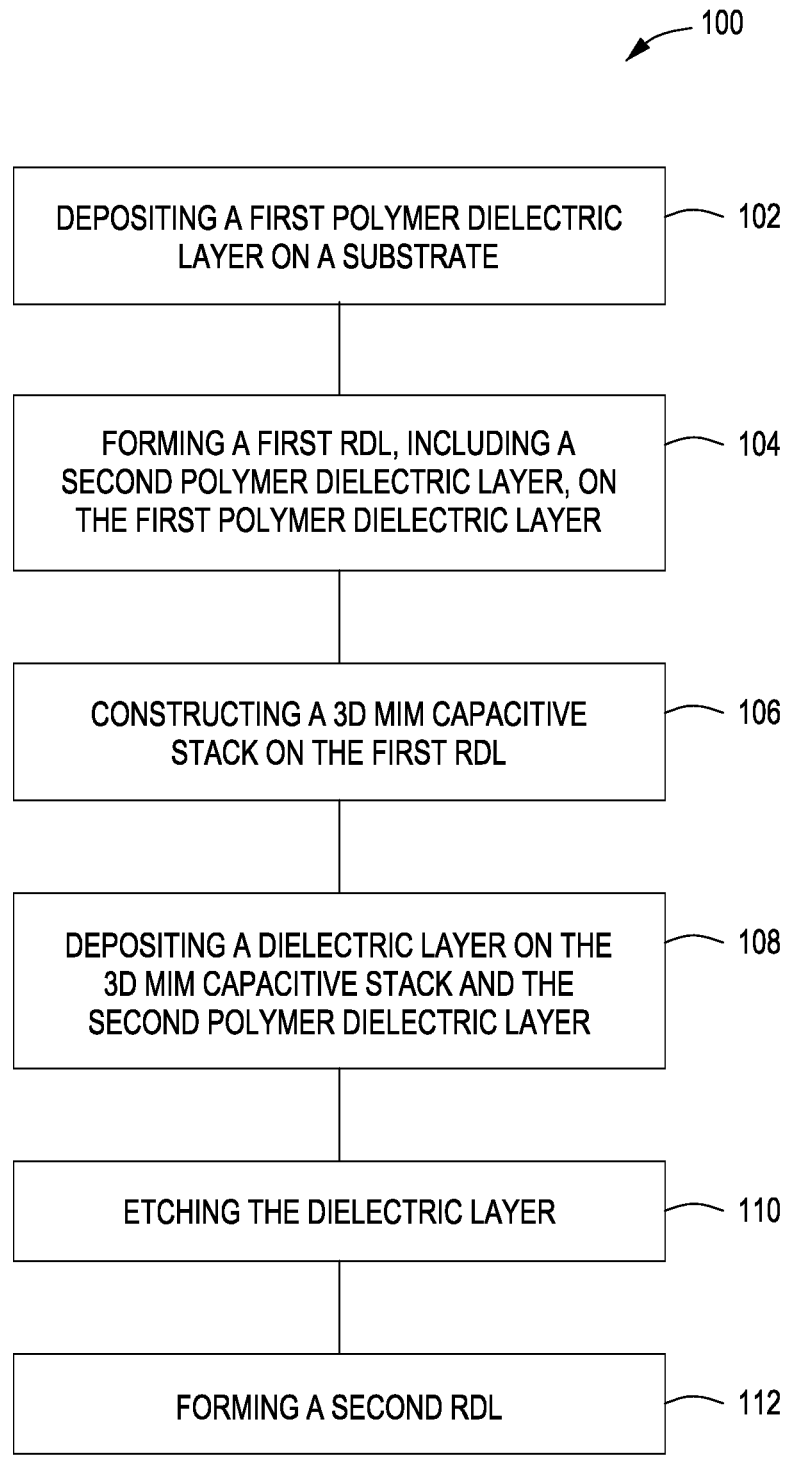
FIG. 1 depicts a flow chart of a method for processing a substrate in accordance with some embodiments of the present principles.

FIG. 1 depicts a flow chart of a method 100 for processing a substrate in accordance with some embodiments of the present principles. Although the method 100 is shown in a functional block diagram of a particular order, processes are not required to be performed in one particular order. Some processes can be repeated and some groupings of processes can be repeated. In the same fashion, some processes may be accomplished prior to other processes and the like.

The method 100 is described in a flow diagram with respect to the structure depicted in FIGS. 2-4. The method 100 of the present principles may be performed in a single process chamber capable of performing both etching and deposition. Such a suitable process chamber may be a standalone process chamber, or part of a cluster tool. Alternatively, the inventive methods disclosed herein may be performed in separate chambers that also may be standalone or part of a cluster tool.

Figure 2A:
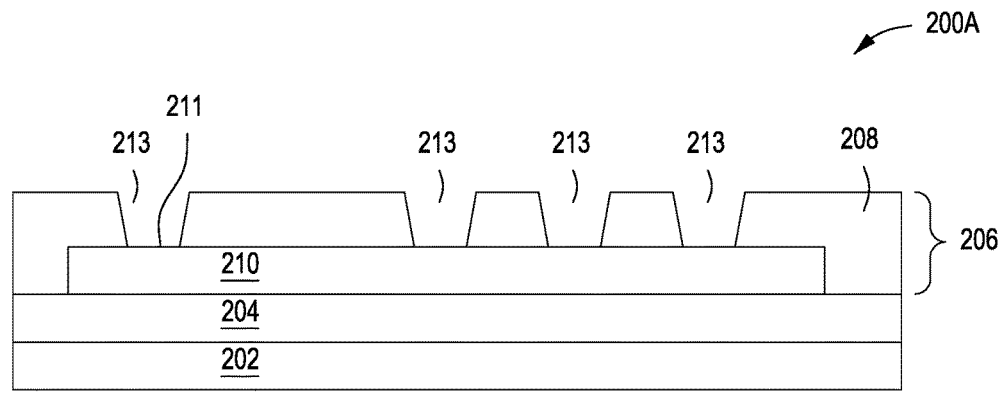
FIGS. 2A-D depict stages of processing a substrate in accordance with some embodiments of the present principles.
Figure 3A:
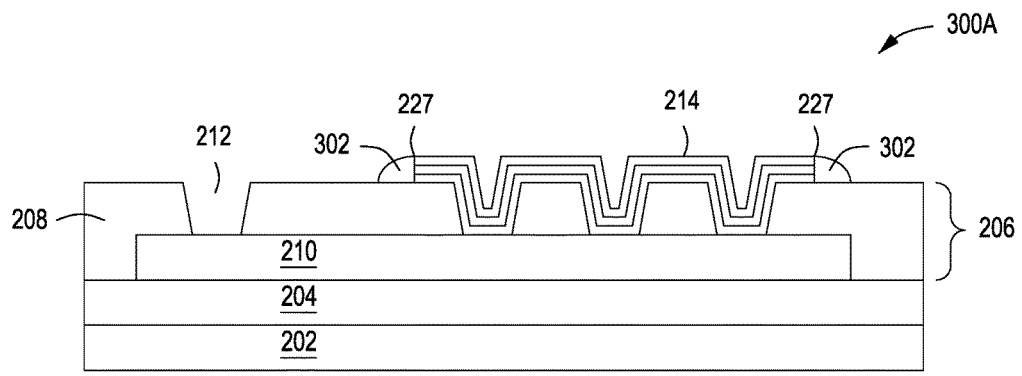
FIGS. 3A-3B depict embodiments of forming a 3D MIM capacitor in accordance with some embodiments of the present principles.

The method 100 begins at block 102 of the flow diagram by providing or depositing a first polymer dielectric layer 204 on a substrate 202 as depicted, for example, in FIG. 2A. The substrate 202 may be any suitable substrate material used in semiconductor manufacturing processes. For example, the substrate 202 may be constructed from silicon, glass, ceramic, epoxy mold compound or dielectric. The first polymer dielectric layer 204 may comprise any suitable polymer dielectric material such as polyimide or polybenzoxazole, or the like. The first polymer dielectric layer 204 is spin-coated over the substrate 202. The first polymer dielectric layer 204 may also be deposited using any suitable spin-coating process, chemical vapor deposition (CVD) process, or lithographic process. In some embodiments, the first polymer dielectric layer 204 may also be a polybenzoxazole (PBO) layer, a polyimide layer, a benzocyclobutene (BCB) layer, an epoxy layer, or a photo-sensitive material layer.

A first redistribution layer (RDL) 206 is formed on the first polymer dielectric layer 204 at block 104 of the flow diagram as shown, for example, in the cross-sectional view 200A of FIG. 2A. The first RDL 206 includes a second polymer dielectric layer 208 having a metal layer 210 and a plurality of openings 213 formed in the second polymer dielectric layer 208. The metal layer 210 may comprise any suitable conductive material used to form a metal interconnect such as copper or aluminum, or the like. The first RDL 206 is a layer to redirect connectivity and is provided over the first polymer dielectric layer 204. In some embodiments, the metal layer 210 may be formed using a plating process or deposition process, such as a physical vapor deposition (PVD) process, used in a semiconductor manufacturing processes. The second polymer dielectric layer 208 is patterned to form the plurality of openings 213. The openings 213 are formed to a top surface 211 of the metal layer 210. In some embodiments, the patterning process may be any suitable lithographic and/or etching process for forming openings in the second polymer dielectric layer 208. In some embodiments, the openings 213 may be a feature such as a via (e.g., such as via 212 in FIG. 2B), a trench, or the like. RDLs used in some embodiments may be fan-out or fan-in.

Figure 2B:
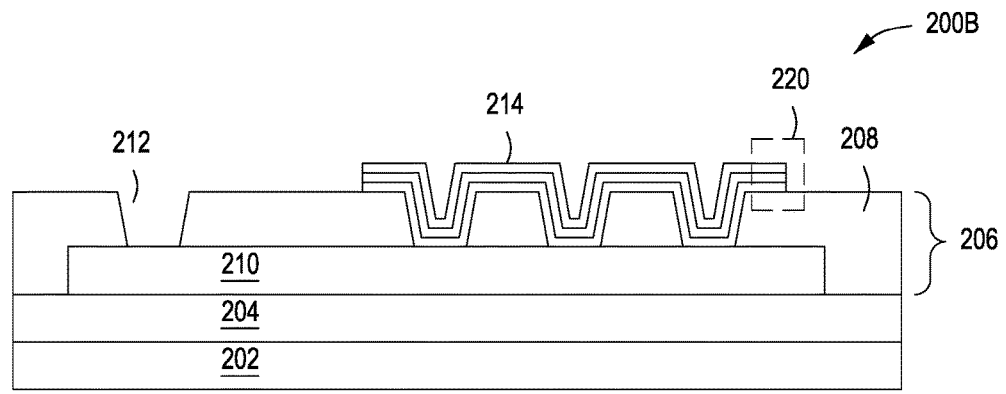
Figure 2C:
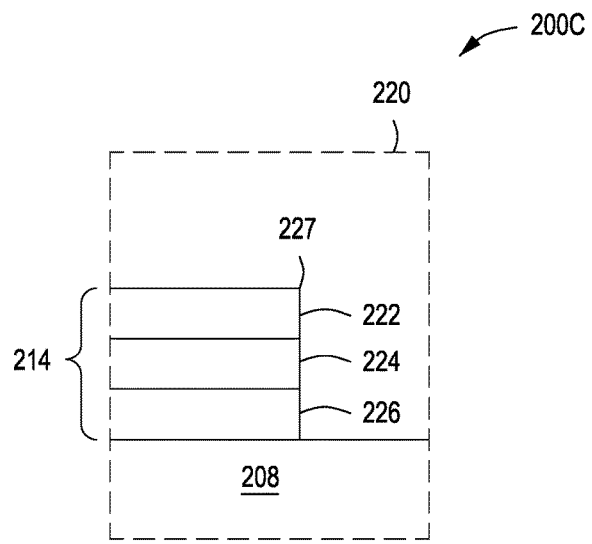
Figure 2D:
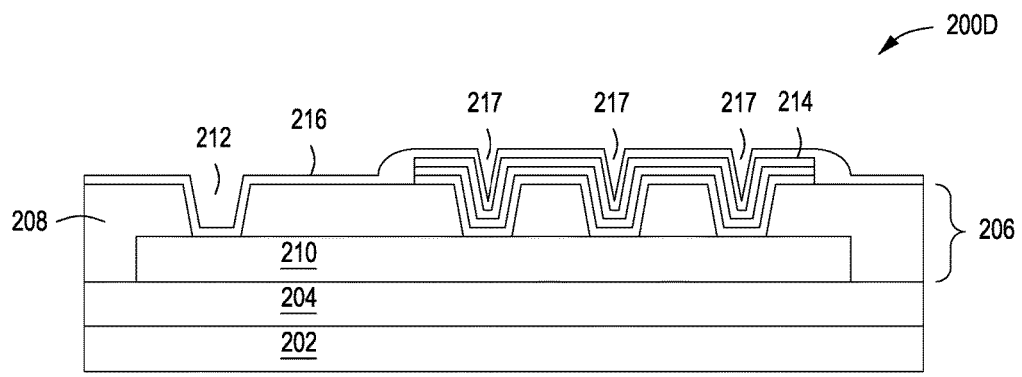

A 3D MIM capacitive stack is then constructed on the first RDL 206 at block 106 of the flow diagram as shown, for example, in the cross-sectional view 200B of FIG. 2B. The 3D MIM capacitive stack 214 may be constructed, for example, by processes provided in U.S. patent application Ser. No. 15/288,594, by Guan Huei See, et al., published on Apr. 13, 2017 as 2017-0104056, and entitled *Structure And Method Of Fabricating Three-Dimensional (3D) Metal-Insulator-Metal (MIM) Capacitor And Resistor In Semi-Additive Plating Metal Wiring*. FIG. 2C illustrates a cross-sectional view 200C of an end portion 220 of the 3D MIM capacitive stack 214 of FIG. 2B. A bottom electrode layer 226 is first formed on the second polymer dielectric layer 208. The bottom layer electrode 226 has conductive properties and is typically made of a metallic-based material. A capacitive dielectric layer 224 is then formed on the bottom electrode layer 226. The dielectric material of the capacitive dielectric layer 224 can vary depending on the capacitor characteristics. In some embodiments, the capacitive dielectric layer 224 is a nitride film or a high-k dielectric material, such as hafnium oxide ($HfO_2$), silicon nitride ($Si_3N_4$), aluminum nitride (AlN), titanium oxide ($TiO_2$) or tantalum oxide ($Ta_2O_5$). A top electrode layer 222 is then formed on the capacitive dielectric layer 224. The top electrode layer 222 can be made of the same material as the bottom electrode or of a different material. The top electrode layer 222 has conductive properties as well. The layers 222-226 may be deposited using any suitable deposition process, for example a physical vapor deposition (PVD) process, a chemical vapor deposition (CVD) process, an atomic layer deposition (ALD) process, or the like.

RDLs are often used to form conductive connections to the top electrode layer 222 and the bottom electrode layer 226. Exposure of the ends of the layers 222-226 at a sidewall 227 of the 3D MIM capacitive stack 214 can result in leakage currents that drastically reduce the performance of the 3D MIM capacitive stack 214. Previous processes required that an additional polymer dielectric layer be formed over the 3D MIM capacitive stack and then an additional RDL be formed on the additional polymer dielectric layer to reduce the leakage current. Embodiments of the present principles do not require the additional polymer dielectric layer and the additional RDL, advantageously saving processing time and materials, reducing costs, and greatly enhancing the performance of a 3D MIM capacitor by reducing leakage currents and also connection lengths. However, additional optional polymer dielectric layers and additional RDLs are not precluded from the embodiments of the present principles.

Instead of forming another polymer layer, a dielectric layer is conformally deposited on the 3D MIM capacitive stack 214 and on the second polymer dielectric layer 208 at block 108 of the flow diagram. One embodiment is shown in the cross-sectional view 200D of FIG. 2D. A dielectric layer 216 may be deposited using any suitable deposition process, for example a PVD process, a CVD process, an ALD process, or the like. In some embodiments, the dielectric layer 216 is a silicon-based material such as, for example, silicon nitride, or silicon oxide. The dielectric layer 216 may have a thickness of approximately 5 nm to approximately 100 nm. In some embodiments, the dielectric layer 216 is conformally deposited so as to cover the bottom and sidewalls of openings 217 of the 3D MIM capacitive stack 214 or via 212 in the second polymer dielectric layer 208.

An etching process is then performed on the dielectric layer 216 at block 110 of the flow diagram. The etching process can include, but is not limited to, dry etching in a reactive ion etching chamber. In the example, the dielectric layer 216 can be etched differently in different embodiments of the present principles. In one embodiment illustrated in cross-sectional view 300A of FIG. 3A, the dielectric layer 216 is etched from the surfaces until a dielectric spacer 302 remains at sidewalls 227 of the 3D MIM capacitive stack 214. In another embodiment illustrated in cross-sectional view 400A of FIG. 4A, the dielectric layer 216 is etched from a bottom surface 402 of a via 212 and from bottom surfaces 404 of the 3D MIM capacitive stack 214.

Figure 3B:
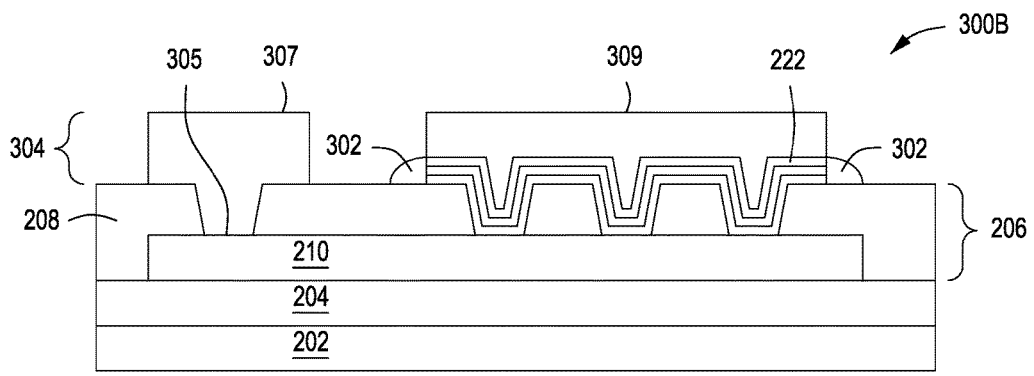

After etching of the dielectric layer, a second RDL is formed on the substrate without a polymer dielectric layer on the dielectric layer and the 3D MIM capacitive stack at block 112 of the flow diagram. If the etching process shown in FIG. 3A has been used, the cross-sectional view 300B of FIG. 3B shows an embodiment of how a second RDL 304 may be formed over the 3D MIM capacitive stack 214 and the first RDL 206. The second RDL 304 forms a first contact 307 with the metal layer 210 of the first RDL 206 in a bottom 305 of the via 212. The second RDL 304 also makes a second contact 309 with the top electrode layer 222 of the 3D MIM capacitive stack 214. The second RDL 304 may be deposited using any suitable deposition process, for example an electroplating process. The second RDL 304 may comprise any suitable conductive material used to form a metal interconnect such as copper (Cu) or aluminum (Al), or the like. The dielectric spacer 302 passivates leakage current of the 3D MIM capacitive stack 214 and eliminates the need to have a third polymer dielectric layer formed over the substrate.

Figure 4A:
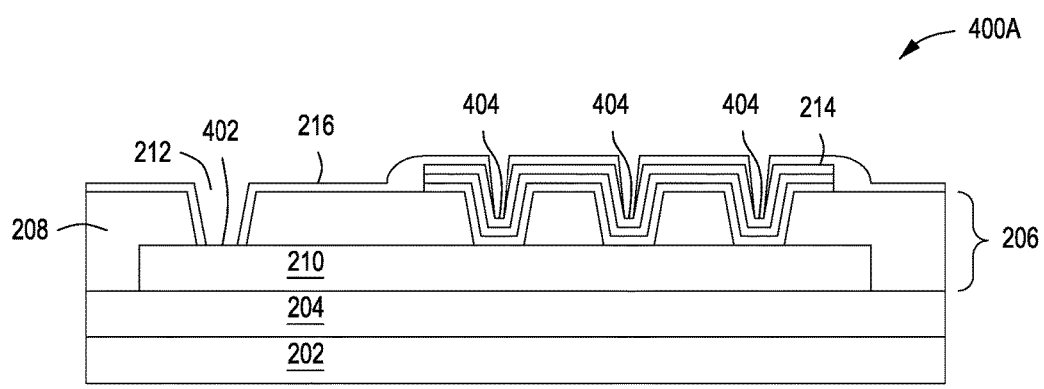
FIGS. 4A-4B depict embodiments of forming a 3D MIM capacitor in accordance with some embodiments of the present principles.
Figure 4B:
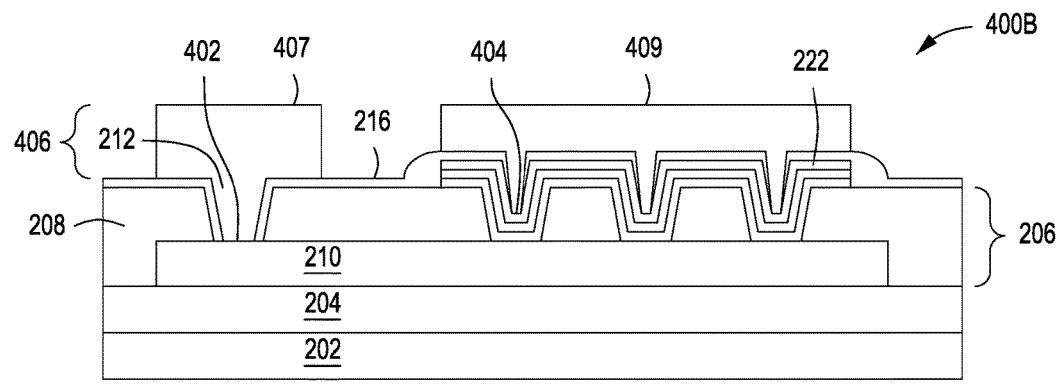

If the etching process shown in FIG. 4A has been used, the cross-sectional view 400B of FIG. 4B shows an embodiment of how a second RDL 406 may be formed over the 3D MIM capacitive stack 214 and the first RDL 206. The second RDL 406 forms a first electrical contact 407 with the metal layer 210 of the first RDL 206 at the bottom surface 402 of the via 212. The second RDL 406 also forms a second electrical contact 409 with the top electrode layer 222 of the 3D MIM capacitive stack 214 at the bottom surfaces 404 of the 3D MIM capacitive stack 214. The second RDL 406 may be deposited using any suitable deposition process, for example an electroplating process. The second RDL 406 may comprise any suitable conductive material used to form a metal interconnect such as copper (Cu) or aluminum (Al), or the like.

In both methods, the dielectric layer 216 is used to insulate the sidewalls 227 of the 3D MIM capacitive stack to reduce leakage currents. One embodiment uses dielectric spacers 302, while the other embodiment uses the dielectric layer 216 to insulate the 3D MIM capacitive stack 214. One advantage of the using the dielectric layer 216 to insulate the 3D MIM capacitor stack is that the etching process time is reduced and less etching damage is likely to occur to lower layers of the first RDL 206.

While the foregoing is directed to embodiments of the present principles, other and further embodiments of the principles may be devised without departing from the basic scope thereof.

The invention claimed is:

1. A method of processing a substrate, comprising:
    providing a first polymer dielectric layer formed on a top surface of the substrate, wherein the entire first polymer dielectric layer is in direct contact with the top surface of the substrate;
    forming a first redistribution layer (RDL) on the first polymer dielectric layer, the first RDL comprising a second polymer dielectric layer with a metal layer embedded in the second polymer dielectric layer and at least one first opening in a top surface of the second polymer dielectric layer to expose at least a portion of the metal layer, the metal layer formed on an uppermost top surface of the first polymer dielectric layer;
    constructing a three-dimensional (3D) metal-insulator-metal (MIM) capacitive stack on the first RDL in the at least one first opening in the top surface of the second polymer dielectric layer, the 3D MIM capacitive stack having a top electrode, a bottom electrode, and a capacitive dielectric layer interposed between the top electrode and the bottom electrode, the bottom electrode directly beneath the 3D MIM capacitive stack is in direct physical contact with the metal layer;
    depositing a dielectric layer on the 3D MIM capacitive stack and on the second polymer dielectric layer; and
    forming a spacer by removing the dielectric layer from the 3D MIM capacitive stack and from the first RDL except for a portion that is in direct contact with a sidewall of the 3D MIM capacitive stack, wherein the spacer contacts sidewalls of the top electrode, the bottom electrode, and the capacitive dielectric layer.

2. The method of processing the substrate of claim 1, further comprising:
    forming a second RDL without a polymer dielectric layer on the first RDL and the 3D MIM capacitive stack, the second RDL forming an electrical contact with at least a portion of the top electrode of the 3D MIM capacitive stack and forming a direct physical connection with the metal layer via at least one second opening in the top surface of the second polymer dielectric layer.

3. The method of processing the substrate of claim 1, wherein the dielectric layer includes silicon oxide ($SiO_2$) or silicon nitride ($Si_3N_4$).

4. The method of processing the substrate of claim 1, wherein the first and second polymer dielectric layers includes polyimide, polybenzoxazole, phenolic, or epoxy.

5. The method of processing the substrate of claim 1, wherein the metal layer is copper or aluminum.

6. The method of processing the substrate of claim 1, wherein the capacitive dielectric layer includes hafnium oxide ($HfO_2$), silicon nitride ($Si_3N_4$), silicon carbide (SiC), aluminum nitride (AlN), titanium oxide ($TiO_2$) or tantalum oxide ($Ta_2O_5$).

7. The method of processing the substrate of claim 1, further comprising: depositing the dielectric layer to a thickness of approximately 5 nm to approximately 100 nm.

8. A method of processing a substrate, comprising:
    providing a first polymer dielectric layer formed on a top surface of the substrate wherein the entire first polymer dielectric layer is in direct contact with the top surface of the substrate;
    forming a first redistribution layer (RDL) on the first polymer dielectric layer, the first RDL comprising a second polymer dielectric layer with a metal layer embedded in the second polymer dielectric layer and at least one first opening in a top surface of the second polymer dielectric layer to expose at least a portion of the metal layer, the metal layer formed on an uppermost top surface of the first polymer dielectric layer;

constructing a three-dimensional (3D) metal-insulator-metal (MIM) capacitive stack on the first RDL in the at least one first opening in the top surface of the second polymer dielectric layer, the 3D MIM capacitive stack having a top electrode, a bottom electrode, and a capacitive dielectric layer interposed between the top electrode and the bottom electrode, the bottom electrode directly beneath the 3D MIM capacitive stack is in direct physical contact with the metal layer;

depositing a dielectric layer on the 3D MIM capacitive stack and on the second polymer dielectric layer;

removing a first portion of the dielectric layer to expose at least a portion of the top electrode at a bottom of at least one second opening et in the 3D MIM capacitive stack and a second portion of the dielectric layer to expose at least a portion of the metal layer at a bottom of at least one third opening in the second polymer dielectric layer;

after removing the first portion and the second portion of the dielectric layer, a third portion of the dielectric layer above the second polymer dielectric layer is continuous with a fourth portion of the dielectric layer on a sidewall of the at least one third opening in the second polymer dielectric layer and a fifth portion of the dielectric layer on a sidewall of the 3D MIM capacitive stack; and forming a second RDL on the dielectric layer and the 3D MIM capacitive stack, the second RDL forming an electrical contact with the portion of the top electrode at the bottom of the at least one second opening in the 3D MIM capacitive stack and forming an electrical contact with the metal layer at the bottom of the at least one third opening in the second polymer dielectric layer.

9. The method of processing the substrate of claim 8, further comprising:
forming the second RDL without a polymer dielectric layer on the dielectric layer and the 3D MIM capacitive stack.

10. The method of processing the substrate of claim 8, wherein the dielectric layer includes silicon oxide ($SiO_2$) or silicon nitride ($Si_3N_4$).

11. The method of processing the substrate of claim 8, wherein the first or the second polymer dielectric layer includes polyimide, polybenzoxazole, phenolic or epoxy.

12. The method of processing the substrate of claim 8, wherein the metal layer is copper or aluminum.

13. The method of processing the substrate of claim 8, wherein the capacitive dielectric layer includes hafnium oxide ($HfO_2$), silicon nitride ($Si_3N_4$), silicon carbide (SiC), aluminum nitride (AlN), titanium oxide ($TiO_2$) or tantalum oxide ($Ta_2O_5$).

14. The method of processing the substrate of claim 8, further comprising: depositing the dielectric layer to a thickness of approximately 5 nm to approximately 100 nm.

15. A substrate, comprising:
a first polymer dielectric layer;
a metal layer on an uppermost top surface of the first polymer dielectric layer;
a second polymer dielectric layer on the first polymer dielectric layer and the metal layer, wherein the second polymer dielectric layer comprises at least one first opening and at least one second opening etched to a top surface of the metal layer;
a three-dimensional (3D) metal-insulator-metal (MIM) capacitive stack formed on the second polymer dielectric layer with a bottom electrode of the 3D MIM capacitive stack making direct physical contact with the metal layer via the at least one first opening in the second polymer dielectric layer, the 3D MIM capacitive stack having a top electrode, a bottom electrode, and a capacitive dielectric layer interposed between the top electrode and the bottom electrode;
a conformal dielectric layer on the 3D MIM capacitive stack and the second polymer dielectric layer, the conformal dielectric layer having at least one third opening to the metal layer formed in the at least one second opening in the second polymer dielectric layer and at least one fourth opening to the top electrode of the 3D MIM capacitive stack formed in the at least one first opening in the second polymer dielectric layer, wherein the at least one third opening only exposes a bottom of the at least one second opening and the at least one fourth opening only exposes a portion of the top electrode at a bottom of the at least one first opening;
wherein a first portion of the conformal dielectric layer above the second polymer dielectric layer is continuous with a second portion of the conformal dielectric layer on a sidewall of the at least one second opening in the second polymer dielectric layer and a third portion of the conformal dielectric layer on a sidewall of the 3D MIM capacitive stack;
a first contact formed on the second polymer dielectric layer, the first contact making direct physical contact with the metal layer in the at least one second opening in the second polymer dielectric layer; and
a second contact formed on the 3D MIM capacitive stack, the second contact making direct physical contact with the top electrode of the 3D MIM capacitive stack.

16. The substrate of claim 15, wherein the conformal dielectric layer includes silicon oxide ($SiO_2$) or silicon nitride ($Si_3N_4$).

17. The substrate of claim 15, wherein the first and second polymer dielectric layers include polyimide, polybenzoxazole, phenolic or epoxy.

18. The substrate of claim 15, wherein the metal layer is copper or aluminum.

19. The substrate of claim 15, wherein the capacitive dielectric layer includes hafnium oxide ($HfO_2$), silicon nitride ($Si_3N_4$), silicon carbide (SiC), aluminum nitride (AlN), titanium oxide ($TiO_2$) or tantalum oxide ($Ta_2O_5$).

20. The substrate of claim 15, wherein the conformal dielectric layer is approximately 5 nm to approximately 100 nm in thickness.

* * * * *

UNITED STATES PATENT AND TRADEMARK OFFICE
CERTIFICATE OF CORRECTION

PATENT NO. : 10,475,735 B2
APPLICATION NO. : 15/623704
DATED : November 12, 2019
INVENTOR(S) : Suo et al.

Page 1 of 1

It is certified that error appears in the above-identified patent and that said Letters Patent is hereby corrected as shown below:

In the Claims

Column 7, on Line 14, delete "et".

Signed and Sealed this
Twenty-eighth Day of January, 2020

Andrei Iancu
*Director of the United States Patent and Trademark Office*